United States Patent
Komori et al.

(10) Patent No.: US 6,847,080 B2
(45) Date of Patent: Jan. 25, 2005

(54) SEMICONDUCTOR DEVICE WITH HIGH AND LOW BREAKDOWN VOLTAGE AND ITS MANUFACTURING METHOD

(75) Inventors: Hirofumi Komori, Yokohama (JP); Mitsuru Yoshikawa, Tsuchiura (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/324,294

(22) Filed: Dec. 19, 2002

(65) Prior Publication Data

US 2003/0124864 A1 Jul. 3, 2003

(30) Foreign Application Priority Data

Dec. 28, 2001 (JP) ........................................ 2001-400722

(51) Int. Cl.[7] .............................................. H01L 27/01
(52) U.S. Cl. ...................... 257/344; 257/346; 257/408; 257/339; 257/487; 257/371; 257/391; 257/392
(58) Field of Search ................................. 257/344, 346, 257/408, 339, 487, 371, 391, 392, 900, 334, 338, 61, 129, 168

(56) References Cited

U.S. PATENT DOCUMENTS 6,157,064 A * 12/2000 Huang ........................ 257/344
6,316,302 B1 * 11/2001 Cheek et al. ............... 438/199

* cited by examiner

Primary Examiner—Minhloan Tran
Assistant Examiner—Tan Tran
(74) Attorney, Agent, or Firm—Yingsheng Tung; Wade James Brady, III; Frederick J. Telecky, Jr.

(57) ABSTRACT

The objective of this invention is to provide a semiconductor device and its manufacturing method with which the offset can be kept fixed even in high breakdown voltage MOS transistors, and that can accommodate high voltages for high breakdown voltage MOS transistors and miniaturization of MOS transistors for low voltage drive. Its constitution provides for inner side wall insulating films 14 and 24 and outer side wall insulating films 16 and 26 formed at both sides of the gate electrodes 12 and 22 in both high breakdown voltage transistor TR2 and transistor TR1 for low voltage drive, and heavily doped region 27 is formed in breakdown voltage transistor TR2 using both inner side wall insulating film 24 and outer side wall insulating film 26 as masks so that offset d2 is controlled by the combined widths of the two side wall insulating films. In transistor TR1 for low voltage drive, heavily doped region 15 is formed using only inner side wall insulating film 14 as the mask, and offset d1 is controlled.

9 Claims, 4 Drawing Sheets

SEMICONDUCTOR DEVICE WITH HIGH AND LOW BREAKDOWN VOLTAGE AND ITS MANUFACTURING METHOD

FIELD OF THE INVENTION

This invention relates to a semiconductor device and its manufacturing method. In particular it relates to a semiconductor device that has two types of field-effect transistors with different breakdown voltages, and to a manufacturing method therefor.

BACKGROUND OF THE INVENTION

MOS (metal—oxide film—semiconductor layer) field-effect transistors are widely used as basic elements in semiconductor devices. In ICs (integrated circuits) with a high breakdown voltage, MOS transistors are used that can be driven at a medium to high voltage of around 10 V or higher, for example (hereafter called high breakdown voltage MOS transistors).

FIG. 9 is a schematic cross section that shows the constitution of a high breakdown voltage MOS transistor and its production processes.

Gate insulating film 101, made of silicon oxide, for example, is formed on an active region that will be the channel region on p-type semiconductor substrate 100, which is divided by an element separating and insulating film, not shown. Gate electrode 102, made of polysilicon, for example, is formed as a top layer.

Lightly doped region (LDD dispersion layer) 103, which contains an n-type impurity at a low concentration, and heavily doped region (source-drain dispersion layer) 105, that contain an n-type impurity at a high concentration, are formed in semiconductor substrate 100 at both sides of gate electrode 102. Here, lightly doped region (LDD dispersion layer) 103 is a layer furnished to moderate the drain electrical field.

In a MOS transistor with the aforementioned constitution, offset (d), which is the distance between gate electrode 102 and heavily doped region 105, is around 0.5 μm, for example, and offset d must be set to approximately this dimension or greater to ensure high breakdown voltage characteristics for the transistor.

The manufacturing method for the aforementioned MOS transistor will now be explained.

An element separating and insulating film, not shown, which divides the active regions that will be channel regions, is formed on p-type semiconductor substrate 100; gate insulating film 101 made of silicon oxide is formed by thermal oxidation, for example; polysilicon is further deposited by a CVD (chemical vapor deposition) method, for example; the resist film for the gate electrode pattern is patterned with a photolithography process; and etching, such as RIE (reaction ion etching) is applied to pattern the gate electrode shape to produce gate electrode 102.

Next an n-type impurity is ion implanted at a low concentration using gate electrode 102 as the mask to form lightly doped region 103.

Next resist film 104 is formed so that offset d from gate electrode 102 will be a prescribed value, an n-type impurity DT is ion implanted at a high concentration using said resist film 104 as the mask, and heavily doped region 105 is formed.

In the aforementioned manufacturing method, offset d, which is the distance between gate electrode 102 and heavily doped region 105, is controlled by the position at which the resist film that serves as a mask is formed, so that misaligning the mask has a significant effect on breakdown voltage characteristics, and this is a problem.

On the other hand, the constitution shown in FIG. 10 is widely used as a low voltage MOS transistor when using sub-micron rules or quarter-micron rules.

Gate insulating film 201, made of silicon oxide, for example, is formed on the active region that will be the channel formation region of p-type semiconductor substrate 200 that is divided ay an element separating and insulating film, not shown. Gate electrode 202 made of polysilicon, for example, is formed as a top layer.

Side wall insulating film 204, made of silicon oxide, for example, is formed at both sides of gate electrode 202. Lightly doped region 203, that contains an n-type impurity at a low concentration, is formed in semiconductor substrate 200 on both sides of gate electrode 202, corresponding to the region below side wall insulating film 204, and heavily doped region 205, that contains an n-type impurity at a high concentration, is formed in semiconductor substrate 200, corresponding to both regions outside of side wall insulating film 204.

The manufacturing method for the aforementioned MOS transistor will now be explained.

An element separating and insulating film, not shown, which divides the active regions that will be the channel regions is formed on p-type semiconductor substrate 200; gate insulating film 201, made of silicon oxide, is formed by thermal oxidation, for example; polysilicon is additionally deposited with CVD, for example; the resist film for the gate electrode pattern is patterned with a photolithography process; and etching, such as RIE, is applied to pattern the gate electrode shape and produce gate electrode 202.

Next, an n-type impurity is ion implanted at a low concentration using gate electrode 202 as a mask and lightly doped region 203 is formed.

Next a silicon oxide film is deposited by CVD, for example, over the entire surface, and then this silicon oxide film is removed by etching back the entire surface to leave silicon oxide in the regions at both sides of gate electrode 202, and side wall insulating film 204 is formed.

Next n-type impurity DT is ion implanted at a high concentration using side wall insulating film 204 as the mask, and heavily doped region 205 is formed.

In the aforementioned manufacturing method, offset d, which is the distance between gate electrode 202 and heavily doped region 205, can be controlled by the width of side wall insulating film 204.

The width of side wall insulating film 204 can be controlled by the deposition width of the silicon oxide that will form side wall insulating film 204. Because of this, the MOS transistor can be manufactured to keep offset d fixed, that is, to keep the characteristics fixed.

However, if a high breakdown voltage MOS transistor is constituted as shown in FIG. 9 and a low breakdown voltage MOS transistor is constituted as shown in FIG. 10, in a semiconductor device that has the aforementioned high breakdown voltage MOS transistor and low breakdown voltage MOS transistor on the same substrate, the manufacturing processes for the two transistors are not compatible, and there still remains the problem that the effect on breakdown voltage characteristics due to misalignment of the mask is significant in the high breakdown voltage MOS transistor.

A method for constituting both a high breakdown voltage MOS transistor and a low voltage MOS transistor as shown in FIG. 10 has been considered. With this method, it is easy to keep offset d fixed even in the high breakdown voltage MOS transistor.

However, if higher voltages for high breakdown voltage MOS transistors and further miniaturization of low voltage MOS transistors are promoted, a side wall insulating film that satisfies requirements for both transistors cannot be realized.

Thus higher voltages for high breakdown voltage MOS transistors and further miniaturization of low voltage MOS transistors cannot be accommodated.

This invention was devised taking the aforementioned circumstances into consideration. Thus the purpose of this invention is to provide a semiconductor device, and a manufacturing method therefor, where the offset can easily be kept fixed even in high breakdown voltage MOS transistors, and that can accommodate higher voltages for high breakdown voltage MOS transistors and further miniaturization of low voltage MOS transistors.

REFERENCE NUMERALS AS SHOWN IN THE DRAWINGS

Figure 1:
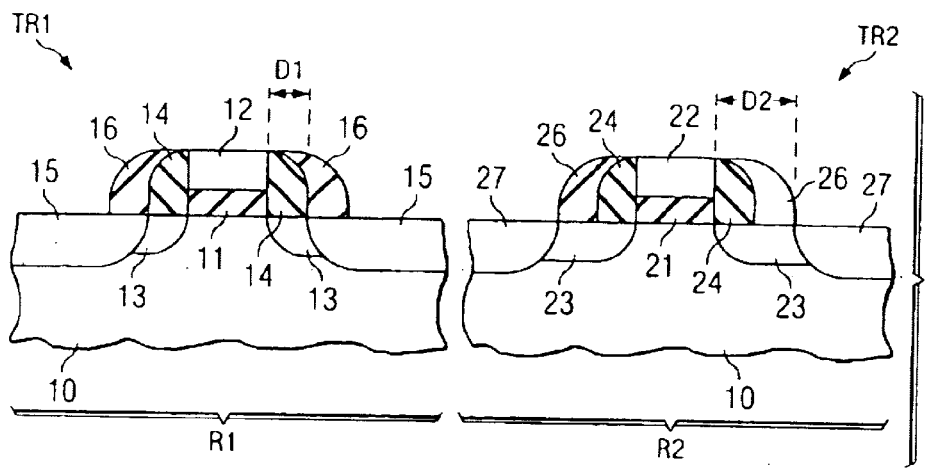
FIG. 1 is a cross section of a semiconductor device associated with a first embodiment.

In the figures, 10, 100, 200 represent a semiconductor substrate, 11 a first gate insulating film, 12 a first gate electrode, 13 a first lightly doped region, 14 a first inner side wall insulating film, 15 a first heavily doped region, 16 a first outer side wall insulating film, 21 a second gate insulating film, 22 a second gate electrode, 23 a second lightly doped region, 24 a second inner side wall insulating film, 26 a second outer side wall insulating film, 27, 27a a second heavily doped region, 30, 31, 32, 33 a resist film, 101, 201 a gate insulating film, 102, 202 a gate electrode, 103, 203 a lightly doped region, 104 a resist film, 204 a side wall insulating film, 105, 205 a heavily doped region, R1 a first transistor formation region, R2 a second transistor formation region, TR1 a low voltage MOS transistor, TR2 a high breakdown voltage MOS transistor, $D_1$–$D_5$, DT a conductive impurity, and d1, d2, d an offset.

DETAILED DESCRIPTION OF THE INVENTION

In order to accomplish the aforementioned purpose, this invented semiconductor device is a semiconductor device that has a first transistor and a second transistor having different breakdown voltages. The aforementioned first transistor is formed in the first transistor formation region of a semiconductor region of a first conductive type and has: a first channel formation region formed in the aforementioned semiconductor region, a first gate insulating film formed on the aforementioned region in the aforementioned first channel formation region, a first gate electrode formed on the aforementioned first gate insulating film, a first inner side wall insulating film formed at both sides of the aforementioned first gate electrode, a first outer side wall insulating film formed at both sides of the aforementioned first inner side wall insulating film, a first lightly doped region that contains a low concentration of a conductive impurity of a second conductive type and that is formed to contact the aforementioned first channel formation region in the aforementioned semiconductor region corresponding to the region below the aforementioned first inner side wall insulating film, and a first heavily doped region that contains a higher concentration of a conductive impurity of a second conductive type than the aforementioned first lightly doped region and that is formed to contact the aforementioned first lightly doped region in the aforementioned semiconductor region corresponding to the region below the aforementioned first outer side wall insulating film and the region below both sides of the aforementioned first outer side wall insulating film. The aforementioned second transistor is formed in the second transistor formation region of the semiconductor region of the aforementioned first conductive type and has: a second channel formation region formed in the aforementioned semiconductor region, a second gate insulating film formed on the aforementioned semiconductor region in the aforementioned second channel formation region, a second gate electrode formed on the aforementioned second gate insulating film, a second inner side wall insulating film formed at both sides of the aforementioned second gate electrode, a second outer side wall insulating film formed at both sides of the aforementioned second inner side wall insulating film, a second lightly doped region that contains a low concentration of a conductive impurity of a second conductive type and that is formed to contact the aforementioned second channel formation region in the aforementioned semiconductor region corresponding to the region below the aforementioned second inner side wall insulating film and the aforementioned second outer side wall insulating film, and a second heavily doped region that contains a higher concentration of a conductive impurity of a second conductive type than the aforementioned second lightly doped region and that is formed to contact the aforementioned second lightly doped region in the aforementioned semiconductor region corresponding to the region below both sides of the aforementioned second outer side wall insulating film.

In this aforementioned invented semiconductor device, the depth of the aforementioned second lightly doped region is ideally made deeper than the depth of the aforementioned second heavily doped region.

Also ideally, a punchthrough prevention layer that contains a higher concentration of an impurity of a first conductive type than the aforementioned second channel formation region is formed in the part of the aforementioned second lightly doped region next to the aforementioned second channel formation region.

This aforementioned invented semiconductor device ideally has a structure where a high-melting-point metal silicide is formed on the surfaces of the aforementioned second gate electrode and the aforementioned second heavily doped region.

With this aforementioned invented semiconductor device, the impurity concentration of the aforementioned first lightly doped region and the aforementioned second lightly doped region are ideally the same.

This aforementioned invented semiconductor device is constituted with an inner side wall insulating film and an outer side wall insulating film formed at both sides of the gate electrode, along with a high breakdown voltage MOS transistor and a low voltage MOS transistor.

However, the heavily doped region of the high breakdown voltage MOS transistor is formed using both the inner side wall insulating film and the outer side wall insulating film as masks, and the offset, which is the distance between the gate electrode and the heavily doped region, can be controlled by the combined widths of the two side wall insulating films. The heavily doped region of the low voltage MOS transistor is formed using only the inner side wall insulating film as the mask, and the offset is controlled by the width of the inner side wall insulating film.

Thus, offset can be kept fixed even in a high breakdown voltage MOS transistor, and furthermore, the offset of the high breakdown voltage MOS transistor and of the low voltage MOS transistor can each be set independently. Therefore higher voltages for high breakdown voltage MOS transistors and further miniaturization of low voltage MOS transistors can be accommodated.

In order to accomplish the aforementioned purpose, this invented semiconductor device manufacturing method is a manufacturing method for a semiconductor device that has a first transistor and a second transistor with different breakdown voltages. It has: a process where a first gate insulating film is formed in a first transistor formation region, and a second gate insulating film is formed in a second transistor formation region, on a semiconductor region of a first conductive type that is equipped with a first channel formation region in the first transistor formation region and a second channel formation region in the second transistor formation region; a process where a first gate electrode is formed on the aforementioned first gate insulating film in the first transistor formation region, and a second gate electrode is formed on the aforementioned second gate insulating film in the second transistor formation region; a process where a conductive impurity of a second conductive type is introduced at a low concentration into the aforementioned semiconductor region in the first transistor formation region using the aforementioned first gate electrode as a mask and a first lightly doped region is formed to contact the aforementioned first channel formation region; a process where a conductive impurity of a second conductive type is introduced at a low concentration into the aforementioned semiconductor region in the second transistor formation region using the aforementioned second gate electrode as a mask and a second lightly doped region is formed to contact the aforementioned second channel formation region; a process where a first inner side wall insulating film is formed at both sides of the aforementioned first gate electrode in the first transistor formation region, and a second inner side wall insulating film is formed at both sides of the aforementioned second gate electrode in the second transistor formation region; a process where a conductive impurity of a second conductive type is introduced at a high concentration into the aforementioned semiconductor region in the first transistor formation region using the first inner side wall insulating film as a mask and a first heavily doped region is formed to contact the aforementioned first lightly doped region; a process where a first outer side wall insulating film is formed at both sides of the aforementioned first inner side wall insulating film in the first transistor formation region, and a second outer side wall insulating film is formed at both sides of the aforementioned second inner side wall insulating film in the second transistor formation region; and a process where a conductive impurity of a second conductive type is introduced at a high concentration into the aforementioned semiconductor region in the second transistor formation region using the second inner side wall insulating film and the second outer side wall insulating film as the mask and a second heavily doped region is formed to contact the aforementioned second lightly doped region.

In this aforementioned invented semiconductor device manufacturing method, the depth of the aforementioned second lightly doped region is ideally formed to be deeper than the depth of the aforementioned second heavily doped region.

Also ideally, there is additionally a process wherein an impurity of a first conductive type is introduced obliquely, at an angle to the surface of the aforementioned semiconductor region, and a punchthrough prevention layer is formed in the part of the aforementioned second lightly doped region in the second transistor formation region next to the aforementioned second channel formation region, before the aforementioned first inner side wall insulating film and the second inner side wall insulating film are formed.

Ideally, this aforementioned invented semiconductor device manufacturing method additionally has a process wherein a high-melting-point metal silicide layer is formed on the surface of the aforementioned second gate electrode and the aforementioned second heavily doped region in a self-aligning manner in the second transistor formation region after the aforementioned second heavily doped region is formed.

In this aforementioned invented semiconductor device manufacturing method, the process whereby the aforementioned first lightly doped region is formed and the process whereby the aforementioned second lightly doped region is formed are ideally performed simultaneously.

With this aforementioned invented semiconductor device manufacturing method, there is an inner side wall insulating film and an outer side wall insulating film formed at both sides of the gate electrode, along with the high breakdown voltage MOS transistor and the low voltage MOS transistor; and the high breakdown voltage MOS transistor has a heavily doped region formed using both the inner side wall insulating film and the outer side wall insulating film as masks, and the offset, which is the distance between the gate electrode and the heavily doped region, is controlled by the combined widths of the two side wall insulating films. The low voltage MOS transistor has a heavily doped region formed using only the inner side wall insulating film as the mask, and the offset is controlled by the width of the inner side wall insulating film.

Thus the offset can be kept fixed even in high breakdown voltage MOS transistors, and furthermore, the offset of high breakdown voltage MOS transistors and low voltage MOS transistors can each be set independently, so that higher voltages for high breakdown voltage MOS transistors and further miniaturization of the low voltage MOS transistors can be accommodated.

DESCRIPTION OF THE EMBODIMENTS

An embodiment of a semiconductor device and its manufacturing method, associated with this invention, are explained below with reference to the figures.

First Embodiment

FIG. 1 is a cross section of a semiconductor device associated with this embodiment.

First gate insulating film 11, made of silicon oxide, for example, is formed on the active region that will be the first channel formation region of p-type semiconductor substrate 10 that is divided by an element separating and insulating film, not shown. First gate electrode 12, made of polysilicon, for example, is formed as a top layer.

First inner side wall insulating film 14 and first outer side wall insulating film 16 are formed at both sides of first gate electrode 12. They are both constituted from silicon oxide, for example. The width of first inner side wall insulating film 14 is 0.12 µm, for example, and the width of first outer side wall insulating film 16 is 0.40 µm, for example.

First lightly doped region 13, which contains a low concentration of an n-type impurity, is formed to contact the first channel formation region in semiconductor substrate 10, corresponding to the region below first inner side wall insulating film 14.

In addition, first heavily doped region 15, which contains a high concentration of an n-type impurity, is formed to contact first lightly doped region 13 in semiconductor substrate 10, corresponding to the region below first outer side wall insulating film 16 and both regions outside of it.

MOS transistor TR1 for low voltage drive is constituted as described above.

At the same time, second gate insulating film 21, made of silicon oxide, for example, is formed on the active region that will be the second channel formation region of p-type semiconductor substrate 10 that is divided by an element separating and insulating film, not shown. Second gate electrode 22, made of polysilicon, for example, is formed as a top layer.

Second inner side wall insulating film 24 and second outer side wall insulating film 26 are formed at both sides of second gate electrode 22. They are both constituted of silicon oxide, for example. The width of second inner side wall insulating film 24 is 0.12 µm, for example, and the width of second outer side wall insulating film 26 is 0.40 µm, for example.

A second lightly doped region 23, which contains a low concentration of an n-type impurity, is formed to contact the second channel formation region in semiconductor substrate 10 corresponding to the region below second inner side wall insulating film 24 and second outer side wall insulating film 26.

In addition, a second heavily doped region 27, which contains a high concentration of an n-type impurity, is formed to contact the second lightly doped region 23 in semiconductor substrate 10 corresponding to both regions outside of second outer side wall insulating film 26.

High breakdown voltage MOS transistor TR2, which can be driven with a moderate voltage of around 16 V, for example, up to high voltage, is constituted as described above.

In the semiconductor device associated with this aforementioned embodiment, second heavily doped region 27 is formed using both second inner side wall insulating film 24 and second outer side wall insulating film 26 as masks in high breakdown voltage MOS transistor TR2, and offset d2, which is the distance between the second gate electrode 22 and second heavily doped region 27, is controlled by the combined widths of the two side wall insulating films, so that it can be set to establish high breakdown voltage characteristics. For example, the width of second inner side wall insulating film 24 can be 0.12 µm, and the width of second outer side wall insulating film 26 can be 0.40 µm. Therefore offset d2 will be around 0.52 µm.

On the other hand, first heavily doped region 15 is formed in the low voltage MOS transistor using only first inner side wall insulating film 14, and offset d1 is controlled by the width of first inner side wall insulating film 14, so that it is designed to be suited to a low voltage MOS transistor. For example, the width of first inner side wall insulating film 14 can be 0.12 µm, so that offset d1 will be around 0.12 µm.

Thus offsets can easily be kept fixed even in a high breakdown voltage MOS transistor, and furthermore, the offsets of high breakdown voltage MOS transistors and low voltage MOS transistors can each be set independently. Therefore higher voltages for the high breakdown voltage MOS transistor and further miniaturization of the low voltage MOS transistor can be accommodated.

The manufacturing method for the semiconductor device associated with this aforementioned embodiment will now be explained.

Figure 2A:
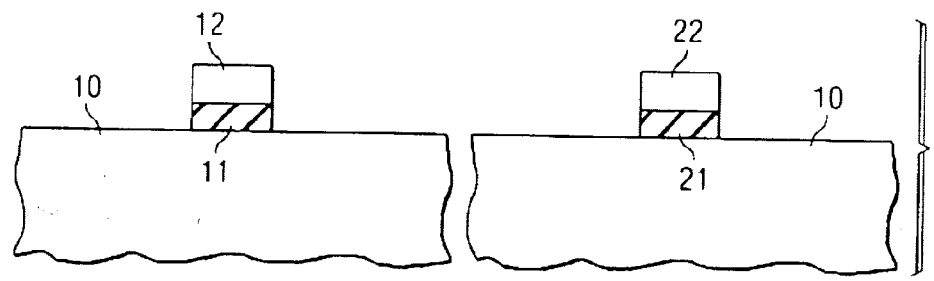
FIGS. 2(a) and (b) are cross sections that show the manufacturing processes for the semiconductor device manufacturing method associated with the first embodiment.

First, as shown in FIG. 2(a), a first gate insulating film 11 is formed in first transistor formation region R1 and a second gate insulating film 21 is formed in second transistor formation region R2 by thermal oxidation, for example, on p-type silicon substrate 10 that is furnished with a first channel formation region in first transistor formation region R1 and with a second channel formation region in the second transistor formation region R2.

Next, polysilicon is deposited using the CVD (chemical vapor deposition) method, for example; the resist film for the gate electrode pattern is patterned using a photolithography process, for example; etching, such as RIE (reactive ion etching), is applied to pattern the shape of the gate electrode; and first gate electrode 12 is formed on first gate insulating film 11 in first transistor formation region R1, while second gate electrode 22 is formed on second gate insulating film 21 in second transistor formation region R2.

Figure 2B:
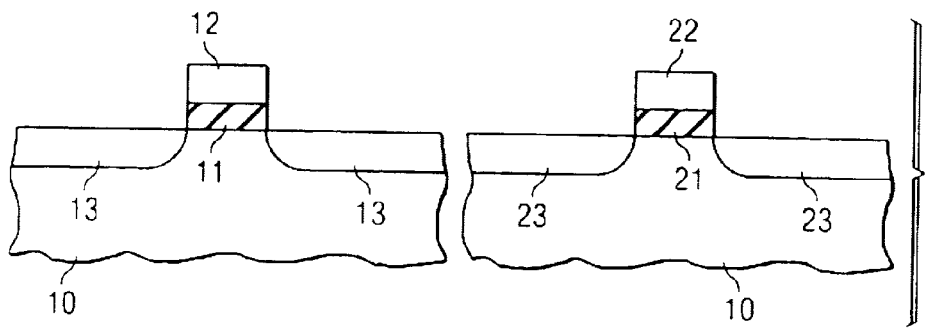

Next, as shown in FIG. 2(b), second transistor formation region R2 is protected by a resist film, not shown, an n-type impurity is ion implanted at a low concentration using first gate electrode 12 as the mask in first transistor formation region R1, and first lightly doped region 13 is formed.

Next, first transistor formation region R1 is protected by a resist film, not shown, an n-type impurity is ion implanted at a low concentration using second gate electrode 22 as the mask in second transistor formation region R2, and second lightly doped region 23 is formed.

If the impurity concentration of first lightly doped region 13 and second lightly doped region 23 can be designed to be the same, ion implantation can be performed simultaneously in first transistor formation region R1 and second transistor formation region R2, rather than protecting first transistor formation region R1 and second transistor formation region R2 from each other as described above, and it is possible to form first lightly doped region 13 and second lightly doped region 23 simultaneously.

Figure 3A:
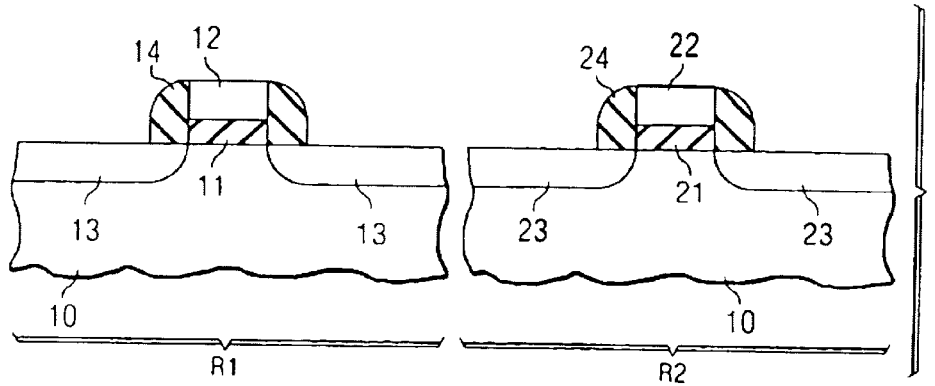
FIGS. 3(a) and (b) are cross sections that show the subsequent processes for FIG. 2.

Next, as shown in FIG. 3(a), silicon oxide is deposited over the entire surface by CVD, for example, this silicon oxide is removed by etching back the entire surface to leave silicon oxide in the portions at both sides of first gate electrode 12 and second gate electrode 22, and first inner side wall insulating film 14 is formed at both sides of first gate electrode 12 in first transistor formation region R1, while second inner side wall insulating film 24 is formed at both sides of second gate electrode 22 in second transistor formation region R2. In this case, for example, the width of first inner side wall insulating film 14 and of second inner side wall insulating film 24 is made about 0.12 μm, and the thickness of the silicon oxide deposited is set to around 0.12 μm.

Figure 3B:
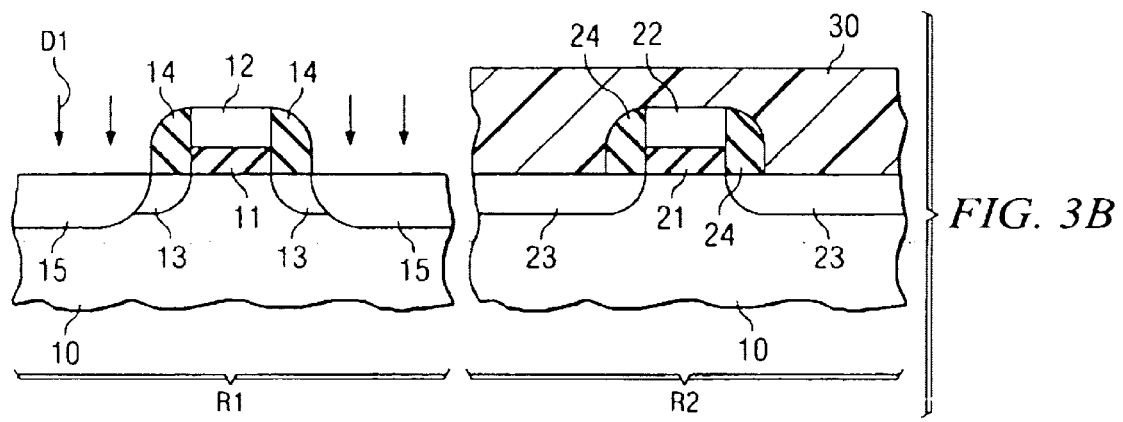

Next, as shown in FIG. 3(b), second transistor formation region R2 is protected by resist film 30, n-type impurity $D_1$ is ion implanted at a high concentration using first inner side wall insulating film 14 as the mask in first transistor formation region R1, and first heavily doped region 15 is formed.

Figure 4A:
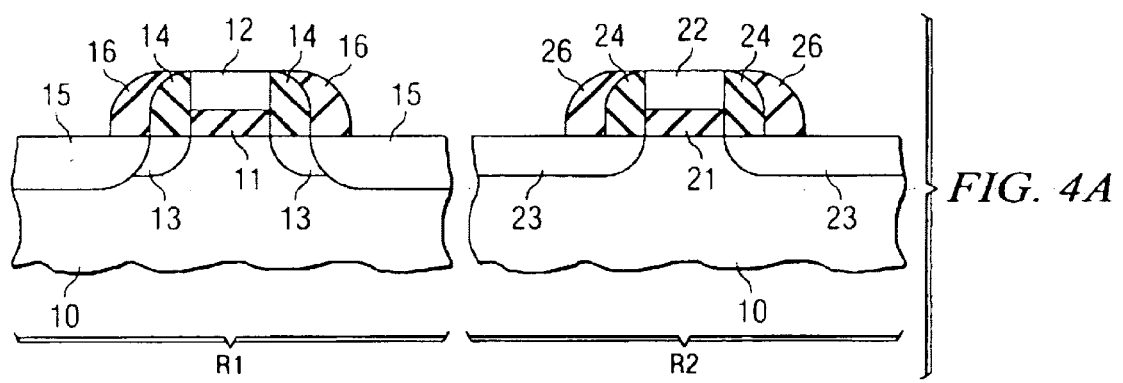
FIGS. 4(a) and (b) are cross sections that show the subsequent processes for FIG. 3.

Next, as shown in FIG. 4(a), silicon oxide is deposited over the entire surface by CVD, for example, and this silicon oxide is removed by etching back the entire surface to leave silicon oxide in the portions at both sides of first inner side wall insulating film 14 and second inner side wall insulating film 24. First outer side wall insulating film 16 is formed at both sides of first inner side wall insulating film 14 in first transistor formation region R1, and second outer side wall insulating film 26 is formed at both sides of second inner side wall insulating film 24 in second transistor formation region R2. In this case, for example, the width of first outer side wall insulating film 16 and second outer side wall insulating film 26 is set to around 0.40 μm, so that the thickness of the silicon oxide film deposited is set to around 0.40 μm.

Figure 4B:
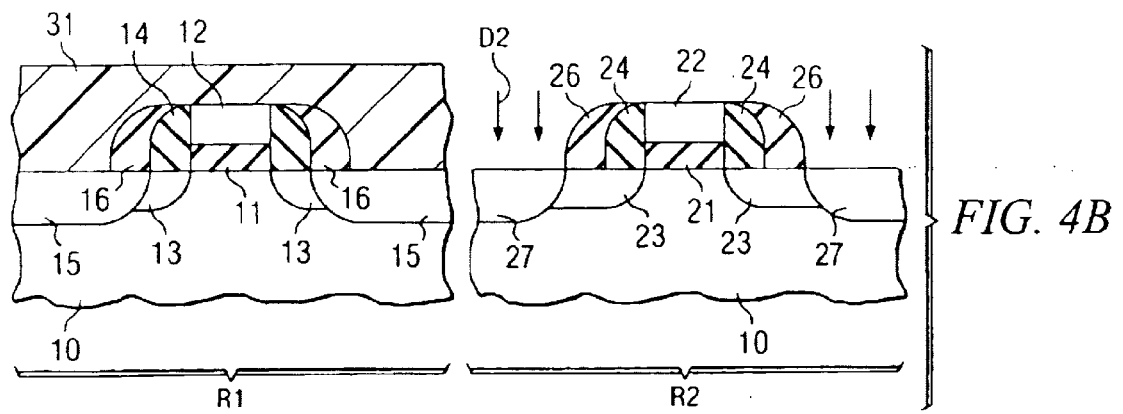

Next, as shown in FIG. 4(b), first transistor formation region R1 is protected by resist film 31, an n-type impurity $D_2$ is ion implanted at a high concentration using second inner side wall insulating film 24 and second outer side wall insulating film 26 as masks in second transistor formation region R2, and second heavily doped region 27 is formed.

The semiconductor device constituted as shown in FIG. 1 can be manufactured as described above.

With the aforementioned semiconductor device manufacturing method associated with this embodiment, second heavily doped region 27 is formed using both second inner side wall insulating film 24 and second outer side wall insulating film 26 as masks in second transistor formation region R2, which is the region where the high breakdown voltage MOS transistor is formed, and offset d2, which is the distance between gate electrode 22 and second heavily doped region 27, is controlled by the combined widths of the two side wall insulating films.

At the same time, first heavily doped region 15 is formed using only first inner side wall insulating film 14 in first transistor formation region R1, which is the region where the low voltage MOS transistor is formed, and offset d1 is controlled by the width of first inner side wall insulating film 14.

Thus, the offset can be kept fixed even in a high breakdown voltage MOS transistor, and furthermore, the offsets of high breakdown voltage MOS transistors and low voltage MOS transistors can each be set independently. Therefore higher voltages for high breakdown voltage MOS transistors and further miniaturization of low voltage MOS transistors can be accommodated.

Second Embodiment

Figure 5:
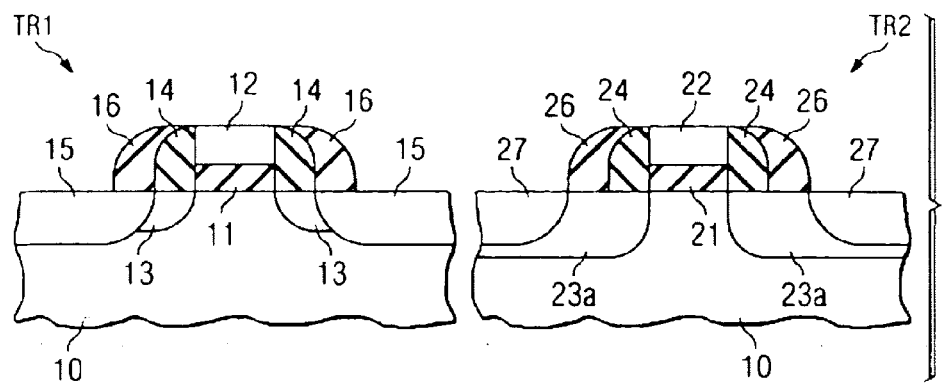
FIG. 5 is a cross section of a semiconductor device associated with a second embodiment.

FIG. 5 is a schematic cross section of a semiconductor device associated with this embodiment.

It is essentially the same as the semiconductor device associated with the first embodiment, but differs in that the depth of second lightly doped region 23a is made deeper than the depth of the second heavily doped region 27, in high breakdown voltage MOS transistor TR2.

For second lightly doped region 23a, the concentration profile of the conductive impurity can be set to match the characteristics required for the high breakdown voltage MOS transistor TR2.

Next the semiconductor device manufacturing method associated with this aforementioned embodiment will be explained.

The processes are the same as for the first embodiment up to where first gate insulating film 11 and second gate insulating film 21 have been formed in first transistor formation region R1 and second transistor formation region R2, first gate electrode 12 has been formed on first gate insulating film 11, and second gate electrode 22 has been formed on second gate insulating film 21.

Figure 6A:
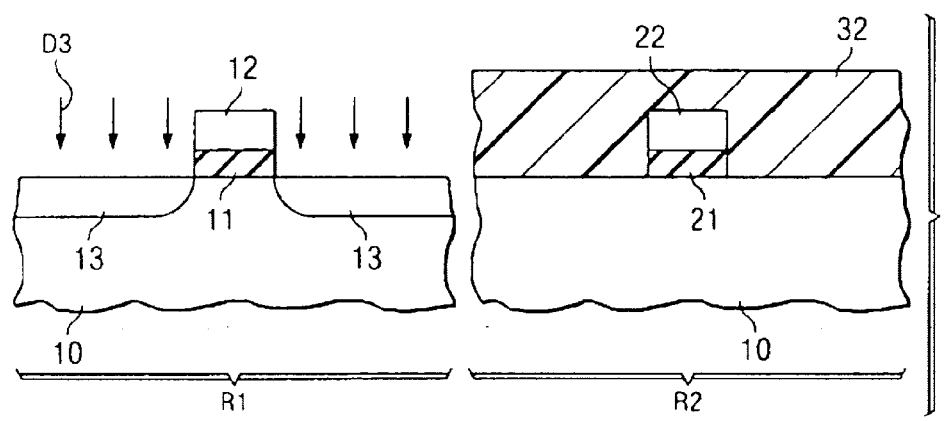
FIGS. 6(a) and (b) are cross sections that show the manufacturing processes for the semiconductor device manufacturing method associated with the second embodiment.

Next, as shown in FIG. 6(a), second transistor formation region R2 is protected by resist film 32, n-type impurity $D_3$ is ion implanted at a low concentration using first gate electrode 12 as a mask in first transistor formation region R1, and first lightly doped region 13 is formed.

Figure 6B:
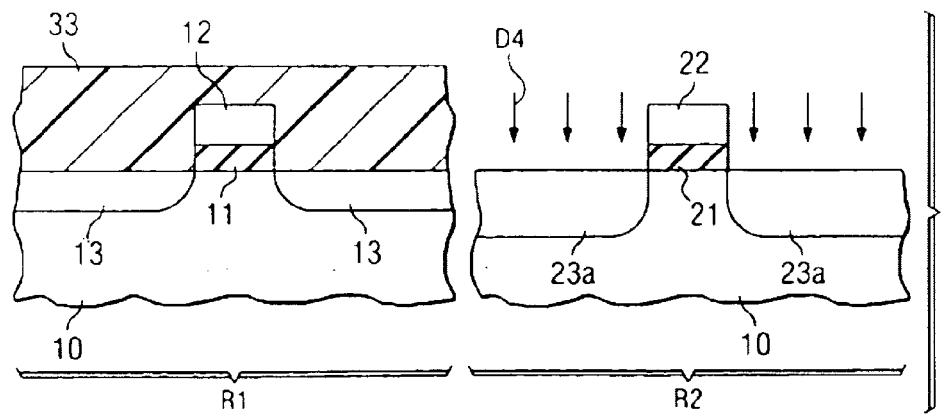

Next, as shown in FIG. 6(b), first transistor formation region R1 is protected by resist film 33, n-type impurity $D_4$ is ion implanted at a low concentration using second gate electrode 22 as a mask in second transistor formation region R2, and second lightly doped region 23a is formed.

Here, to make the depth of second lightly doped region 23a deeper than the depth of first lightly doped region 13, the energy is set higher when n-type impurity $D_4$ is ion implanted than when n-type impurity $D_3$ is ion implanted, so that the impurity will be implanted deeper into the substrate.

In the subsequent processes, the process where second heavily doped region 27 is formed can be performed in the same way as described in the first embodiment by adjusting the implantation energy so that the depth of second lightly doped region 23a will be deeper.

With this aforementioned embodiment, as with the first embodiment, the offset can be kept fixed even in a high breakdown voltage MOS transistor, and furthermore, the offsets of high breakdown voltage MOS transistors and low voltage MOS transistors can each be set independently. Therefore higher voltages for high breakdown voltage MOS transistors and further miniaturization of low voltage MOS transistors can be accommodated.

Figure 7:
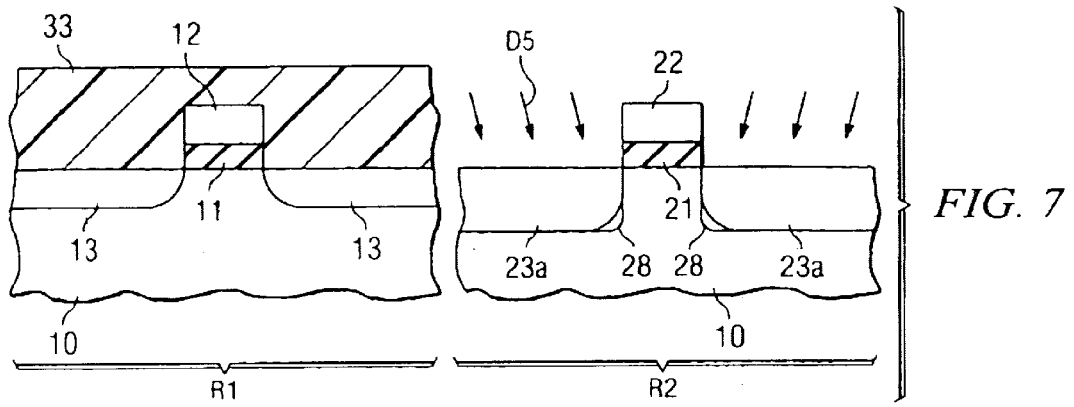
FIG. 7 is a cross section that shows the manufacturing processes for a semiconductor device manufacturing method associated with the second embodiment.

Also, for example, after the process where second lightly doped region 23a has been formed and before the process where first inner side wall insulating film 14 and second inner side wall insulating film 24 are formed as shown in FIG. 7, a p-type conductive impurity can be introduced obliquely, at an angle, such as 45° to the surface of semiconductor substrate 10, for example, in the second transistor formation region, and punchthrough prevention layer 28 can be formed in the part of second lightly doped region 23a next to the second channel formation region.

The profiles of the conductive impurities can be set to match the characteristics required for the high breakdown voltage MOS transistor TR2.

Third Embodiment

Figure 8:
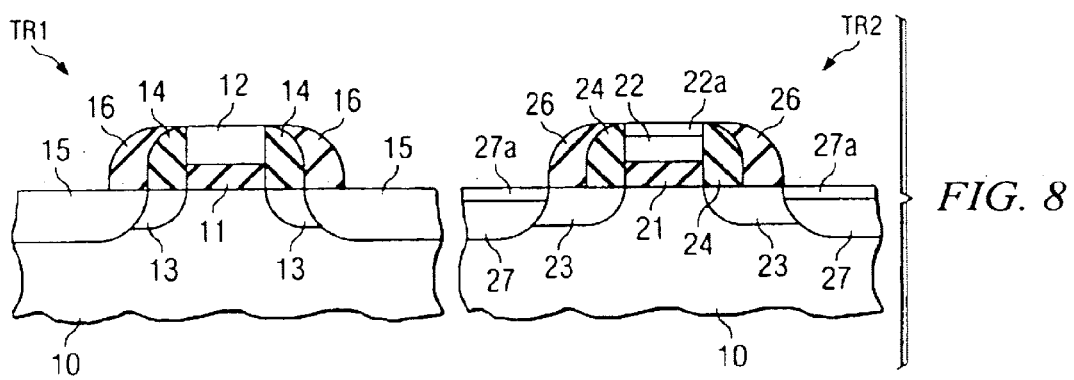
FIG. 8 is a cross section of a semiconductor device associated with a third embodiment.
Figures 9, 10:
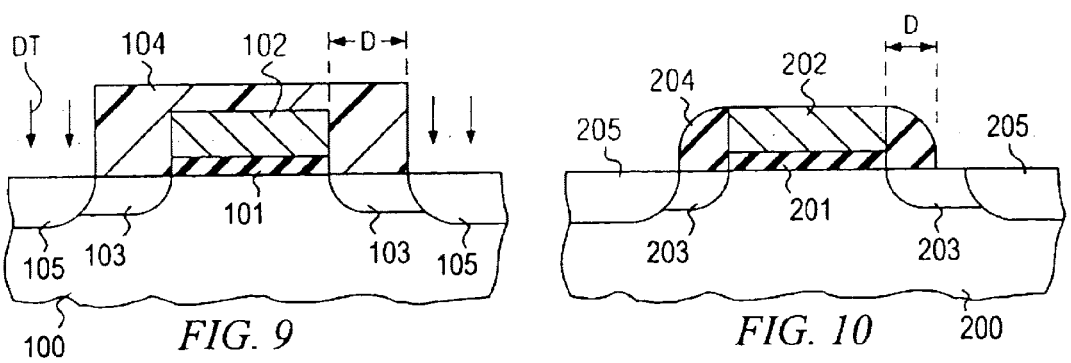
FIG. 9 is a cross section of a semiconductor device associated with a first conventional example.
FIG. 10 is a cross section of a semiconductor device associated with a second conventional example.

FIG. 8 is a cross section of a semiconductor device associated with this embodiment.

It is essentially the same as the semiconductor device associated with the first embodiment, but it differs in that it has a silicide structure wherein high-melting-point metal silicide layers 22a and 27a such as tungsten silicide or molybdenum silicide, are formed on the surface of second gate electrode 22 and of second heavily doped region 27 in high breakdown voltage MOS transistor TR2.

A MOS transistor can thus be realized on which high-melting-point metal silicide layers (22a and 27a) are formed, and resistance is reduced.

The semiconductor device manufacturing method associated with this aforementioned embodiment will now be explained.

After MOS transistor TR1 for low voltage drive and high breakdown voltage MOS transistor TR2 are formed the same way as in the first embodiment, MOS transistor TR1 for low voltage drive is protected by a resist film, deposition of a high-melting-point metal, such as tungsten or molybdenum, by sputtering, for example, and siliciding are performed in second transistor formation region R2 to form high-melting-point metal layers 22a and 27a by self-aligning on the surface of second gate electrode 22 and second heavily doped region 27. The semiconductor device shown in FIG. 8 can be manufactured by removing the unreacted high-melting-point metal.

With this aforementioned embodiment, in the same way as in the first embodiment, the offset can be kept fixed even in a high breakdown voltage MOS transistor, and furthermore, the offsets of high breakdown voltage MOS transistors and low voltage MOS transistors can each be set independently. Therefore higher voltages for high breakdown voltage MOS transistors and further miniaturization of low voltage MOS transistors can be accommodated.

Also, with a conventional constitution where the side wall insulating film is a single layer, there are instances where the gate and the source-drain short circuit because of the silicide process, but in this embodiment, gate electrode 22 and heavily doped region 27, which will be the source-drain, can be sufficiently separated spatially, and the occurrence of short circuits can be controlled.

This invention is not limited to the aforementioned embodiments.

For example, the embodiments were explained for n-channel transistors, but the invention can also be applied to p-channel transistors by replacing the p-type semiconductor substrate (p-type semiconductor region) with an n-type semiconductor substrate (n-type semiconductor region) and the n-type impurities with p-type impurities. In addition, it can also be applied to a CMOS transistor that has an n-channel transistor and a p-channel transistor. The concentrations of the lightly doped region and the heavily doped region can also be set to the concentrations normally used for those transistors.

Otherwise, a variety of variations can be accomplished without deviating from the essence of this invention.

With this invention, the offset can be kept fixed even in a high breakdown voltage MOS transistor, and furthermore, the offsets of high breakdown voltage MOS transistors and low voltage MOS transistors can each be set independently. Therefore higher voltages for high breakdown voltage MOS transistors and further miniaturization of low voltage MOS transistors can be accommodated.

Also, freedom in drain engineering, which is a key element of technology for designing MOS transistors, will increase, and process controllability will improve.

Also, the width of the side wall insulating film of the high breakdown voltage MOS transistor can be made wider without affecting the performance of the low-voltage MOS transistor by applying silicide technology to lower the resistance of the source-drain part and the gate part to accommodate higher speeds for the low-voltage MOS transistor, and this technology is applicable in the processes for integrating the transistors.

Due to these effects, it will be possible to use high breakdown voltage MOS transistors in the application of the sub-micron rules and quarter-micron rules developed separately, and in the previous generation of high integration CMOS processes without changing transistor performance.

What is claimed is:

1. An integrated circuit, comprising:
    a first transistor, having a first breakdown voltage, in a first region near the surface of a semiconductor substrate;
    a second transistor, having a second breakdown voltage substantially higher than the first breakdown voltage, in a second region near the surface of the semiconductor substrate,
    wherein:
        the first transistor has a first gate electrode and the second transistor has a second gate electrode, wherein the gate electrodes are separated from the semiconductor substrate by a layer of dielectric material;
        the first transistor has a first channel region near the surface of the semiconductor substrate underneath the first gate electrode and the second transistor has a second channel region near the surface of the semiconductor substrate underneath the second electrode; the channel regions are doped with dopant of a common first conductivity;
        the transistor has first inner sidewall spacers adjacent the first gate electrode and first outer sidewall spacers adjacent to the first sidewall spacers;
        the second transistor has second inner sidewall spacers, substantially identical to the first inner sidewall spacers, adjacent the second gate electrode and second outer sidewall spacers, substantially identical to the second outer sidewall spacers, adjacent to the second inner sidewall spacers;
        the first transistor has first lightly doped source and drain regions underneath the first inner sidewall spacers, doped with dopant of a second conductivity opposite the first conductivity, adjacent and receding from the first channel region;
        the second transistor has second lightly doped source and drain regions underneath the second inner sidewall spacers and the second outer spacers, doped with dopant of th second conductivity, adjacent and receding from the second channel region and;
        the first transistor has first heavily doped source and drain regions underneath the first outer sidewall spacers, doped with dopant of the second conductivity, adjacent the first lightly doped source and drain regions and receding from under the first inner sidewall spacers; and
    the second transistor has second heavily doped source and drain regions, doped with dopant of the second conductivity, adjacent the second lightly doped source and drain regions and receding from under the second sidewall pacers.

2. The integrated circuit of claim 1 wherein:
    the second lightly doped source and drain regions have a first depth and the second heavily doped source and drain regions have second depth and the first depth is greater than the second depth.

3. The integrated circuit of claim 1 wherein:

the first lightly doped source and drain regions have a first depth and the second lightly doped source and drain regions have second depth and the first depth is substantially equal to the second depth.

4. The integrated circuit of claim 3 wherein:

the first lightly doped source and drain regions have a first dopant concentration and the second lightly doped source and drain regions have a second dopant concentration and the first dopant concentration is substantially equal to the second dopant concentration.

5. The integrated circuit of claim 1 wherein the first conductivity is n-type and the second conductivity is p-type.

6. The integrated circuit of claim 1 wherein the first conductivity is p-type and the second conductivity is n-type.

7. The integrated circuit of claim 1 including an n-type transistor and a p-type transistor.

8. The integrated circuit of claim 1 wherein the semiconductor substrate and the gate electrodes include silicon.

9. The integrated circuit of claim 1 wherein the dielectric material and the sidewall spacers include silicon and oxygen.

* * * * *